United States Patent
Matsuda et al.

(10) Patent No.: US 10,845,588 B2
(45) Date of Patent: Nov. 24, 2020

(54) OPTICAL SCANNER AND IMAGING APPARATUS

(71) Applicant: Hitachi, Ltd., Tokyo (JP)

(72) Inventors: Takahiro Matsuda, Tokyo (JP); Yoshiho Seo, Tokyo (JP); Satoshi Ouchi, Tokyo (JP); Shinsuke Onoe, Tokyo (JP)

(73) Assignee: HITACHI, LTD., Tokyo (JP)

( * ) Notice: Subject to any disclaimer, the term of this patent is extended or adjusted under 35 U.S.C. 154(b) by 166 days.

(21) Appl. No.: 16/218,661

(22) Filed: Dec. 13, 2018

(65) Prior Publication Data

US 2019/0204589 A1 Jul. 4, 2019

(30) Foreign Application Priority Data

Dec. 28, 2017 (JP) ................................. 2017-253447

(51) Int. Cl.
*G02B 26/08* (2006.01)
*G02B 26/10* (2006.01)
(Continued)

(52) U.S. Cl.
CPC ....... *G02B 26/101* (2013.01); *G02B 26/0858* (2013.01); *H01L 41/0986* (2013.01); *H02N 2/028* (2013.01); *H01L 41/092* (2013.01)

(58) Field of Classification Search
CPC .............. G02B 26/0858; G02B 26/105; G02B 26/101; G02B 26/0833; G02B 26/0841;
(Continued)

(56) References Cited

U.S. PATENT DOCUMENTS

| 7,158,234 B2 * | 1/2007 | Uchiyama ............ A61B 1/0008 356/479 |
| 7,180,600 B2 * | 2/2007 | Horii .................... A61B 5/0062 356/479 |

(Continued)

FOREIGN PATENT DOCUMENTS

| JP | 2009-192252 A | 8/2009 |
| JP | 2014-180317 A | 9/2014 |

*Primary Examiner* — William R Alexander
*Assistant Examiner* — Tamara Y. Washington
(74) *Attorney, Agent, or Firm* — Mattingly & Malur, PC

(57) ABSTRACT

In an optical scanner 100, a vibration portion 101 includes first and third elements 3021 and 3023 that vibrate a light guide path 102 in a direction substantially perpendicular to an optical axis direction, and second and fourth elements 3022 and 3024 that vibrate the light guide path in a direction substantially perpendicular to a vibration direction thereof. A driving signal is applied to each of electrodes 3011 to 3014, each of which corresponds to one electrode of each of the first to fourth elements, and the other electrode 3015 is used as a common electrode having a floating potential. A driving signal generator 1007 generates a driving signal such that a median value of driving signals $V_{y1}$ and $V_{y2}$ applied to the first and third elements and a median value of driving signals $V_{x1}$ and $V_{x2}$ applied to the second and fourth elements correspond to substantially the same value.

8 Claims, 17 Drawing Sheets

(51) Int. Cl.
*G02B 26/12* (2006.01)
*H02N 2/02* (2006.01)
*H01L 41/09* (2006.01)

(58) Field of Classification Search
CPC ...... G02B 26/085; G02B 26/10; G02B 26/08;
G02B 26/0816; G02B 7/1821; B81B
2201/042; B81B 3/0043; B81B 3/0045;
B81B 2203/0154; B81B 2203/0109;
B81B 2203/0163; G01S 7/4817; G01S
17/42; G01S 17/89; H01L 41/0953; H01L
41/0933; H01L 41/1876; H01L 41/0477;
H01L 41/0946; H01L 41/0471; H04N
9/3129; H04N 9/3135; H04N 13/243;
H04N 1/113
USPC .................................................... 359/199.4
See application file for complete search history.

(56) References Cited

U.S. PATENT DOCUMENTS

| | | | |
|---|---|---|---|
| 8,115,936 B2* | 2/2012 | Ochiai | G01N 29/2418 |
| | | | 356/502 |
| 8,641,195 B2* | 2/2014 | Wakabayashi | G02B 26/101 |
| | | | 353/28 |
| 9,885,877 B2* | 2/2018 | Yonekubo | G02B 27/0176 |
| 2009/0206707 A1 | 8/2009 | Iyoki | |
| 2016/0004072 A1 | 1/2016 | Kasai | |

* cited by examiner

F I G. 1
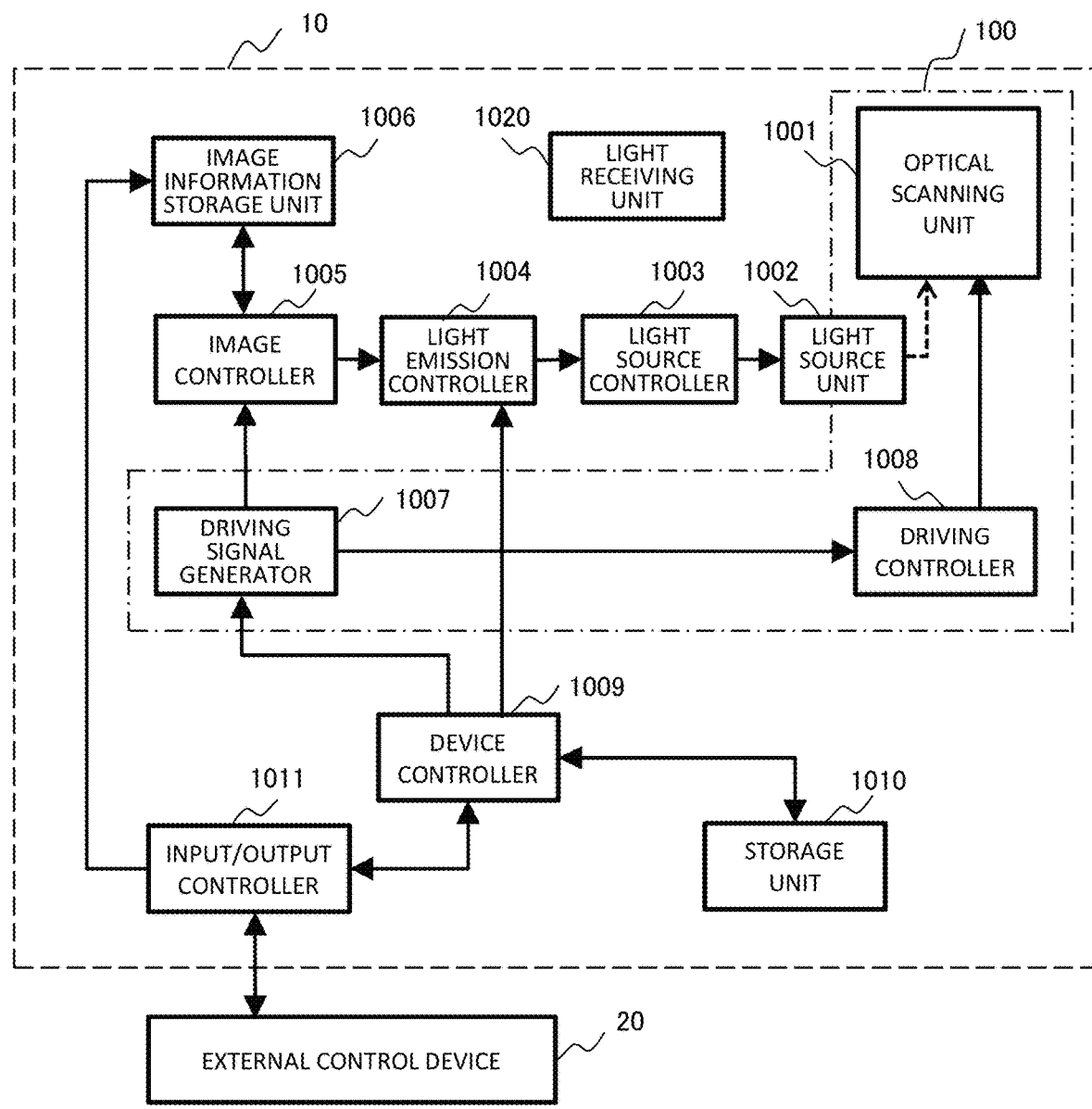

F I G. 2
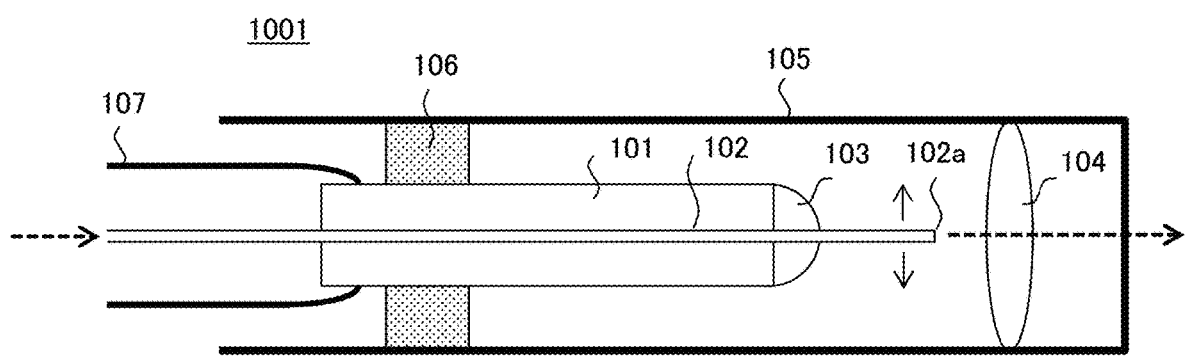

F I G. 6
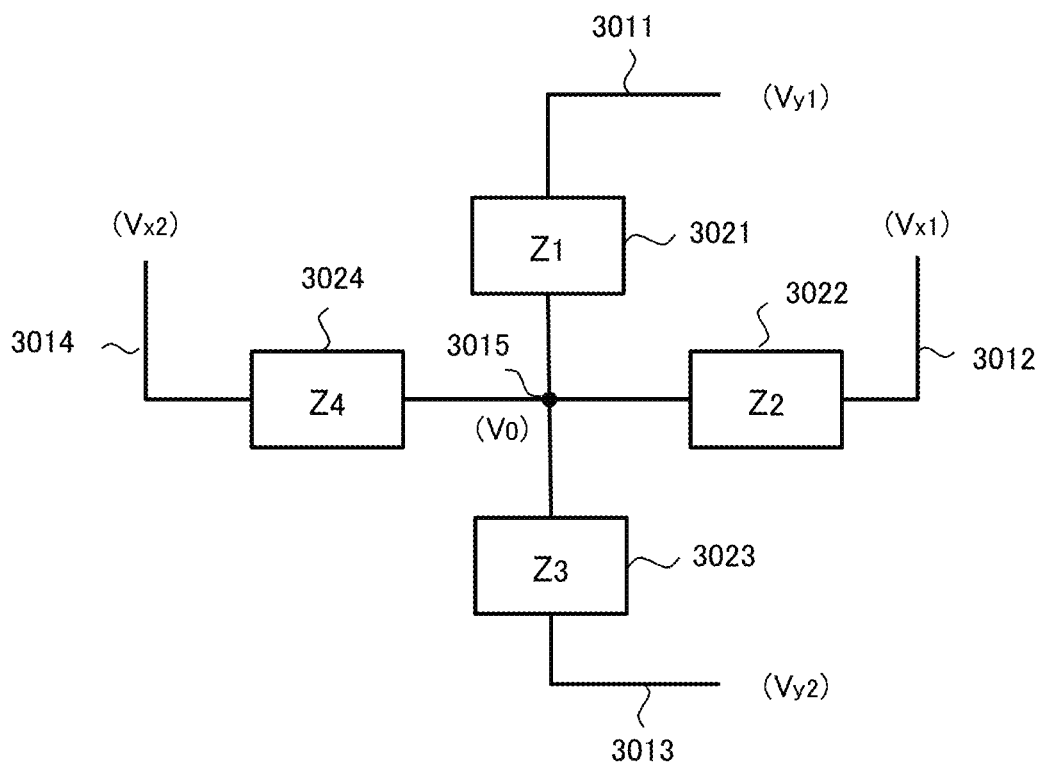

BEFORE CORRECTION

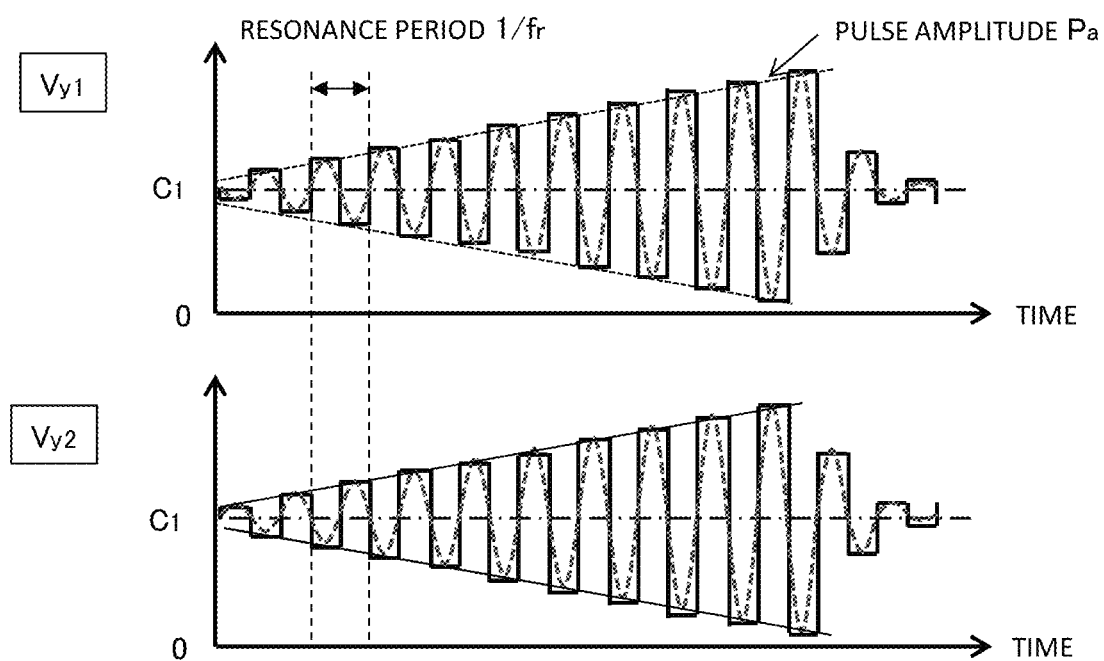
F I G. 13B

F I G. 15
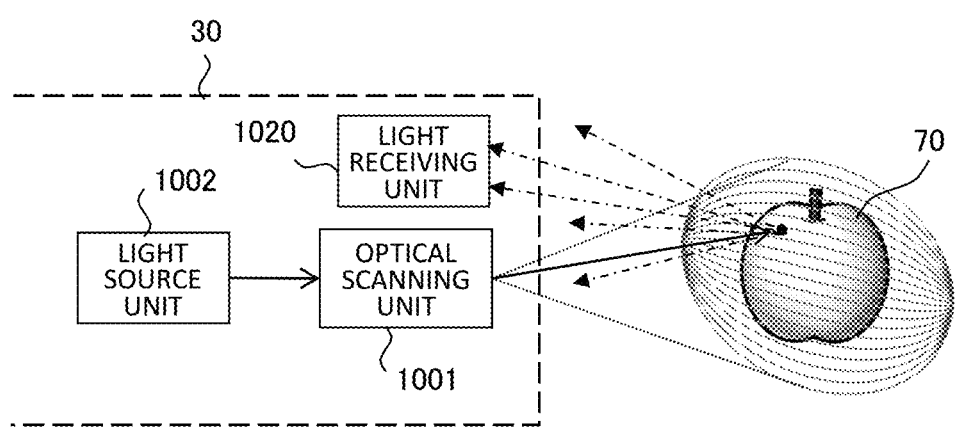

OPTICAL SCANNER AND IMAGING APPARATUS

CLAIM OF PRIORITY

The present application claims priority from Japanese patent application serial No. JP 2017-253447, filed on Dec. 28, 2017, the content of which is hereby incorporated by reference into this application.

BACKGROUND OF THE INVENTION

(1) Field of the Invention

The present invention relates to an optical scanner that scans light by a vibration portion of a piezoelectric element, etc. and an imaging apparatus using the same.

(2) Description of the Related Art

As a technology for scanning light by a vibration portion, JP 2014-180317 A discloses an optical fiber scanner in which a vibration damping member is disposed between a vibration generator and an emission end to allow uniform vibration of an optical fiber. JP 2009-192252 A discloses a configuration in which an outer peripheral surface is covered with a single strip electrode, the electrode is connected to a ground potential, and a voltage is applied to a divided electrode on an inner peripheral surface in order to suppress mixing of noise from a surrounding part in a cylindrical piezoelectric actuator used for a positioning device of a precision instrument, etc.

SUMMARY OF THE INVENTION

In conventional technologies including the above patent documents, an actuator that generates vibration in a plurality of directions has vibration elements (for example, piezoelectric elements) divided into a plurality of (for example, four) parts in a circumferential direction, and an electrical wiring for driving the actuator is connected to an electrode of each of the vibration elements. In this case, even when one electrode of each vibration element is used as a common electrode to perform ground connection, five or more electrical wirings are needed. For this reason, a thickness of a wiring included in the actuator and a joining portion become large, and thus downsizing of the actuator and a device mounted with the actuator is limited. In particular, a wiring at the time of disposing the common electrode on an inner peripheral side has a great influence due to a relatively large thickness of the wiring when compared to an outer peripheral side. Meanwhile, when a wiring for ground connection of the common electrode is eliminated, a potential of the common electrode becomes unstable, and thus an operation of the actuator becomes unstable.

An object of the invention is to provide an optical scanner capable of reducing the number of electrical wirings while maintaining stability of an operation and downsizing the entire apparatus.

An optical scanner of the invention includes a light guide path having one end from which light enters and the other end from which the light is emitted, a vibration portion that applies vibration to the light guide path, and a driving signal generator that generates a driving signal for applying vibration to the vibration portion. The vibration portion includes a first element and a third element cooperatively operating to vibrate the light guide path in a direction substantially perpendicular to an optical axis direction of the light guide path, and a second element and a fourth element cooperatively operating to vibrate the light guide path in a direction substantially perpendicular to the optical axis direction of the light guide path and substantially perpendicular to a vibration direction of the first element and the third element. Each of the first to fourth elements has two electrodes, a driving signal from the driving signal generator is applied to one of the electrodes of each of the first to fourth elements, and the other electrode of each of the first to fourth elements is used as a common electrode having a floating potential with respect to the driving signal. The driving signal generator generates a driving signal such that a median value of a driving signal applied to the first element and a driving signal applied to the third element and a median value of a driving signal applied to the second element and a driving signal applied to the fourth element correspond to substantially the same value.

According to the invention, it is possible to provide an optical scanner capable of reducing the number of electrical wirings while maintaining stability of an operation and downsizing the entire apparatus.

BRIEF DESCRIPTION OF THE DRAWINGS

These and other features, objects and advantages of the present invention will become more apparent from the following description when taken in conjunction with the accompanying drawings wherein:

FIG. 1 is a block diagram illustrating a configuration of an imaging apparatus 10 according to Embodiment 1;

FIG. 2 is a cross-sectional view illustrating a configuration of an optical scanning unit 1001;

FIG. 6 is a diagram illustrating an electrically equivalent circuit of four piezoelectric elements;

FIG. 13B is a diagram illustrating an example of a voltage waveform applied to the vibration portion 101;

FIG. 15 is a diagram illustrating an imaging operation of the imaging apparatus 30 having the distance measurement function.

DETAILED DESCRIPTION OF THE EMBODIMENT

Figure 3:
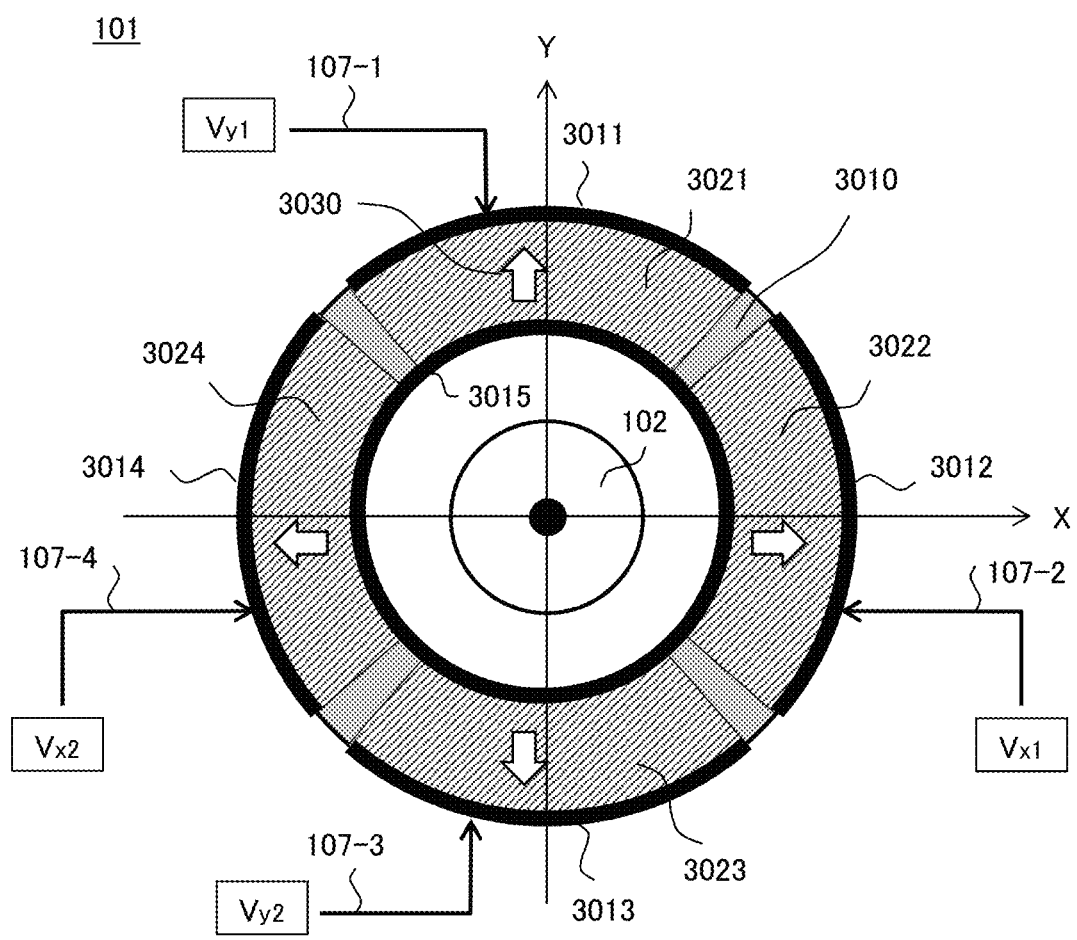
FIG. 3 is a cross-sectional view illustrating a structure of a vibration portion 101.

Hereinafter, embodiments of the invention will be described with reference to drawings.

Embodiment 1

FIG. 1 is a block diagram illustrating a configuration of an imaging apparatus 10 according to Embodiment 1. For example, the imaging apparatus 10 is an apparatus that projects an image such as a projector or a head mounted display, and includes an optical scanner 100 that scans image light on a projection surface.

The imaging apparatus 10 includes an optical scanning unit 1001, a light source unit 1002, a light source controller 1003, a light emission controller 1004, an image controller 1005, an image information storage unit 1006, a driving signal generator 1007, a driving controller 1008, a device controller 1009, a storage unit 1010, an input/output controller 1011, and a light receiving unit 1020. Among these units, the optical scanning unit 1001, and the driving signal generator 1007 and the driving controller 1008 driving the optical scanning unit 1001 are included in the optical scanner 100. Incidentally, the optical scanner 100 may include another element such as the light source unit 1002.

The driving signal generator 1007, the image controller 1005, and the light emission controller 1004 are implemented as a digital circuit as an example. These blocks may be present as functional blocks in an integrated circuit such as an identical IC, for example, a field programmable gate array (FPGA), an application specific integrated circuit (ASIC), etc.

The device controller 1009 controls each block of the imaging apparatus 10. For example, the device controller 1009 includes a central processing unit (CPU), etc. The storage unit 1010 corresponds to a memory area in which a program, data, etc. for performing processing on each unit are stored so that the device controller 1009 controls the imaging apparatus 10, and is realized by, for example, a flash memory, etc. The storage unit 1010 may correspond to another storage medium capable of performing writing and reading such as a hard disc drive (HDD) or an optical disc, or may correspond to a temporary storage area such as a random access memory (RAM).

The input/output controller 1011 is connected to an external control device 20 to receive an image signal from the external control device 20. The input/output controller 1011 may be configured to be integrated in the FPGA or the ASIC as the same digital circuit as the driving signal generator 1007, the image controller 1005, the light emission controller 1004, etc. or configured to be integrated in the device controller 1009. An image signal received from the external control device 20 via the input/output controller 1011 is stored in the image information storage unit 1006.

The driving signal generator 1007 generates a driving signal for scanning image light by driving the optical scanning unit 1001 based on control from the device controller 1009. The driving controller 1008 includes an amplifier, etc. and applies driving power to an actuator unit in the optical scanning unit 1001 according to the driving signal generated by the driving signal generator 1007.

The image controller 1005 receives information about the driving signal from the driving signal generator 1007, and calculates coordinates (x, y) determined according to an optical scanning position. Further, data of a pixel corresponding to the coordinates (x, y) is read from the image information storage unit 1006. For example, pixel data corresponds to RGB gradation data. The pixel data is transmitted to the light emission controller 1004.

The light emission controller 1004 generates a signal for turning ON the light source unit 1002 according to the received pixel data. In this instance, the light emission controller 1004 may correct brightness based on scanning information from the driving signal generator 1007. The light source controller 1003 supplies a current to a laser element in the light source unit 1002 based on the signal generated by the light emission controller 1004 to generate a laser beam. The generated laser beam enters the optical scanning unit 1001 and forms a laser spot at an optically scanned position on the projection surface.

The light receiving unit 1020 receives (photographs) a laser beam scattered by being irradiated on the projection surface. In a case in which the imaging apparatus 10 does not have a photographing function, the light receiving unit 1020 may not be used. In this way, the imaging apparatus 10 performs laser emission control synchronized with the optical scanning position, thereby performing an operation of projecting the image on the projection surface.

FIG. 2 is a cross-sectional view illustrating a configuration of the optical scanning unit 1001. The optical scanning unit 1001 includes a vibration portion 101, a light guide path 102, a joining portion 103, a lens 104, an exterior portion 105, a support member 106, and an electrical wiring portion 107. A laser beam entering from the light source unit 1002 propagates through the light guide path 102 and is emitted to a projection surface via the lens 104. In this instance, an operation of scanning the laser beam on the projection surface is performed by vibrating the light guide path 102 using the vibration portion 101.

The vibration portion 101 is an actuator that generates vibration and includes a piezoelectric actuator. The vibration portion 101 of this example is a cylindrical piezoelectric element having a hollow center portion, and is configured by disposing a plurality of electrodes on inner and outer peripheries thereof. The light guide path 102 is disposed in a hollow part of the vibration portion 101, and the vibration portion 101 and the light guide path 102 are mechanically joined by the joining portion 103. The vibration portion 101 is fixed to the exterior portion 105 by the support member 106.

For example, an optical fiber is used for the light guide path 102. For example, an adhesive, etc. is used for the joining portion 103. One end 102a of the light guide path 102 is used as a free end, and the free end 102a vibrates when vibration of the vibration portion 101 is transmitted to the light guide path 102 by the joining portion 103. The light guide path 102 has a structure of a projecting beam in which one end is used as a free end and has a natural frequency $f_r$ determined by a material constant and a dimension.

The lens 104 is a lens molded of glass, resin, etc. In addition to a spherical lens illustrated in the drawing, the lens 104 may correspond to an aspheric lens, a Fresnel lens, or a refractive index distribution type lens. In addition, the lens 104 may be integrated with a distal end 102a of the light guide path 102, or may include a plurality of lenses.

FIG. 3 is a cross-sectional view illustrating a structure of the vibration portion 101. The vibration portion 101 is a cylindrical piezoelectric actuator (cylindrical actuator) having a hollow inside, and includes a cylindrical piezoelectric medium 3010 having piezoelectricity. The piezoelectric actuator is a device that generates distortion (extension or contraction) by application of a voltage in an application direction according to the voltage.

A common electrode 3015 is included on an inner peripheral portion of the cylindrical actuator, and a first outer peripheral electrode 3011, a second outer peripheral electrode 3012, a third outer peripheral electrode 3013, and a fourth outer peripheral electrode 3014 divided into four parts at intervals of approximately 90 degrees in a cylindrical axial rotation direction are disposed on an outer peripheral portion. The common electrode 3015 and the four outer peripheral electrodes 3011 to 3014 are continuously disposed in a planar shape along a longitudinal direction of the cylindrical actuator. The light guide path 102 is disposed at a center of the cylindrical actuator.

Figure 4:
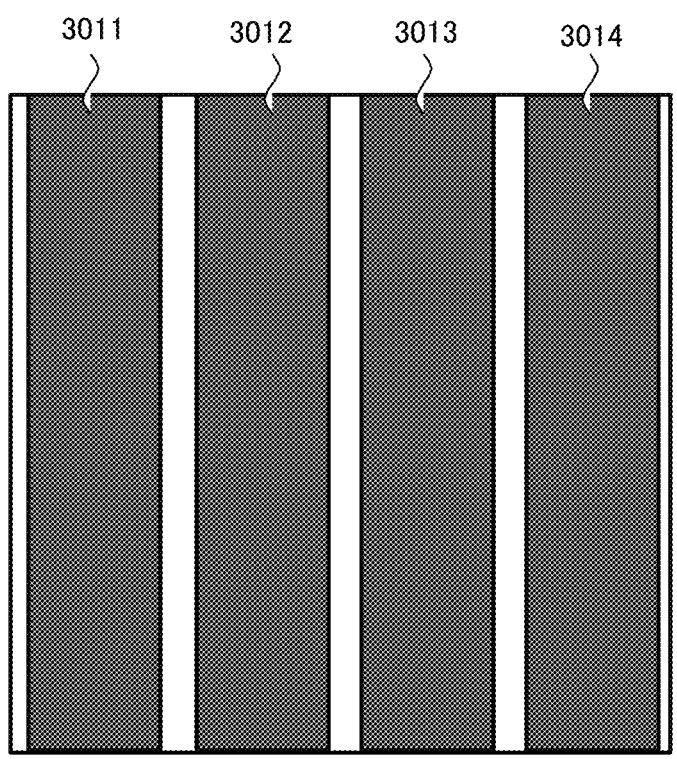
FIG. 4 is a developed view illustrating a shape of four outer peripheral electrodes.

FIG. 4 is a diagram illustrating a shape of the four outer peripheral electrodes by developing an outer peripheral side surface. The outer peripheral electrodes 3011 to 3014 having substantially equal sizes are aligned in parallel in the longitudinal direction of the cylindrical actuator.

Returning to FIG. 3, the four outer peripheral electrodes 3011 to 3014 are connected to the driving controller 1008 by electrical wiring portions 107-1 to 107-4, respectively, and drive voltages $V_y$, $V_{x1}$, $V_{y2}$, and $V_{x2}$ are applied thereto, respectively. However, a characteristic is that the electrical wiring portions are not connected to the common electrode 3015 on the inner peripheral portion and are in a floating state, that is, are not connected to the ground potential. In this way, reducing the number of wirings to the electrodes has an effect of downsizing the device. In particular, since the wiring to the inner peripheral portion becomes unnecessary, assembling work becomes easy.

The piezoelectric medium 3010 forms a plurality of piezoelectric elements for each region interposed by the respective electrodes. In this example, four regions interposed between the four electrodes disposed on the outer periphery of the piezoelectric medium 3010 and the electrode on the inner periphery function as piezoelectric elements. That is, a first piezoelectric element 3021 interposed between the first outer peripheral electrode 3011 and the common electrode 3015, a second piezoelectric element 3022 interposed between the second outer peripheral electrode 3012 and the common electrode 3015, a third piezoelectric element 3023 interposed between the third outer peripheral electrode 3013 and the common electrode 3015, and a fourth piezoelectric element 3024 interposed between the fourth outer peripheral electrode 3014 and the common electrode 3015 are included.

To form the piezoelectric elements by division into a plurality of regions on the piezoelectric medium 3010, before attaching the respective electrodes, a predetermined voltage is applied in advance to perform polarization processing, and, for example, polarization is performed in a radial direction as indicated by an arrow 3030. Then, the electrodes are attached to the piezoelectric medium 3010 (the respective piezoelectric elements) undergoing polarization processing to complete the cylindrical actuator. Alternatively, a wiring portion may be connected to each of the outer peripheral electrodes including the common electrode 3015 to perform polarization processing, and then the wiring portion of the common electrode 3015 may be removed. Each of the piezoelectric elements 3021 to 3024 generates positive distortion (extension) when a voltage is applied in the same direction as a direction of polarization, and generates negative distortion (contraction) when a voltage is applied in an opposite direction. Therefore, it is possible to realize an actuator allowing desired deformation by combining a direction of the polarization 3030 and a direction of an applied voltage.

Hereinafter, a description will be given of an operation of vibrating the light guide path 102 by the cylindrical actuator. For the sake of description, in FIG. 3, toward a surface of paper, a vertical direction is defined as a Y-axis and a lateral direction is defined as an X-axis.

First, a description will be given of a case in which vibration is applied in a Y-axis direction. In a case in which a voltage in a forward direction is applied to the first piezoelectric element 3021 and a voltage in a reverse direction is applied to the third piezoelectric element 3023 facing the first piezoelectric element 3021 in the Y-axis direction with the center portion interposed therebetween to extend the first piezoelectric element 3021 and contract the third piezoelectric element 3023, the light guide path 102 receives a force in a downward direction of the Y-axis. Conversely, when the first piezoelectric element 3021 is contracted, and the third piezoelectric element 3023 is extended, the light guide path 102 receives a force in an upward direction of the Y-axis. In this way, to apply vibration in the Y-axis direction, the first piezoelectric element 3021 and the third piezoelectric element 3023 facing each other in the Y-axis direction are paired and cooperatively operated. A voltage for applying vibration is set to a sinusoidal signal, and a period thereof is set to a period near the natural frequency, thereby causing the light guide path 102 to resonate.

Similarly, in the case of applying vibration in an X-axis direction, the second piezoelectric element 3022 and the fourth piezoelectric element 3024 facing each other in the X-axis direction are paired and cooperatively operated. In other words, a vibration direction by the first piezoelectric element 3021 and the third piezoelectric element 3023 and a vibration direction by the second piezoelectric element 3022 and the fourth piezoelectric element 3024 are in a substantially vertical relation.

Incidentally, the vibration portion 101 applicable to the present drive scheme is not limited to the cylindrical actuator.

Figure 5:
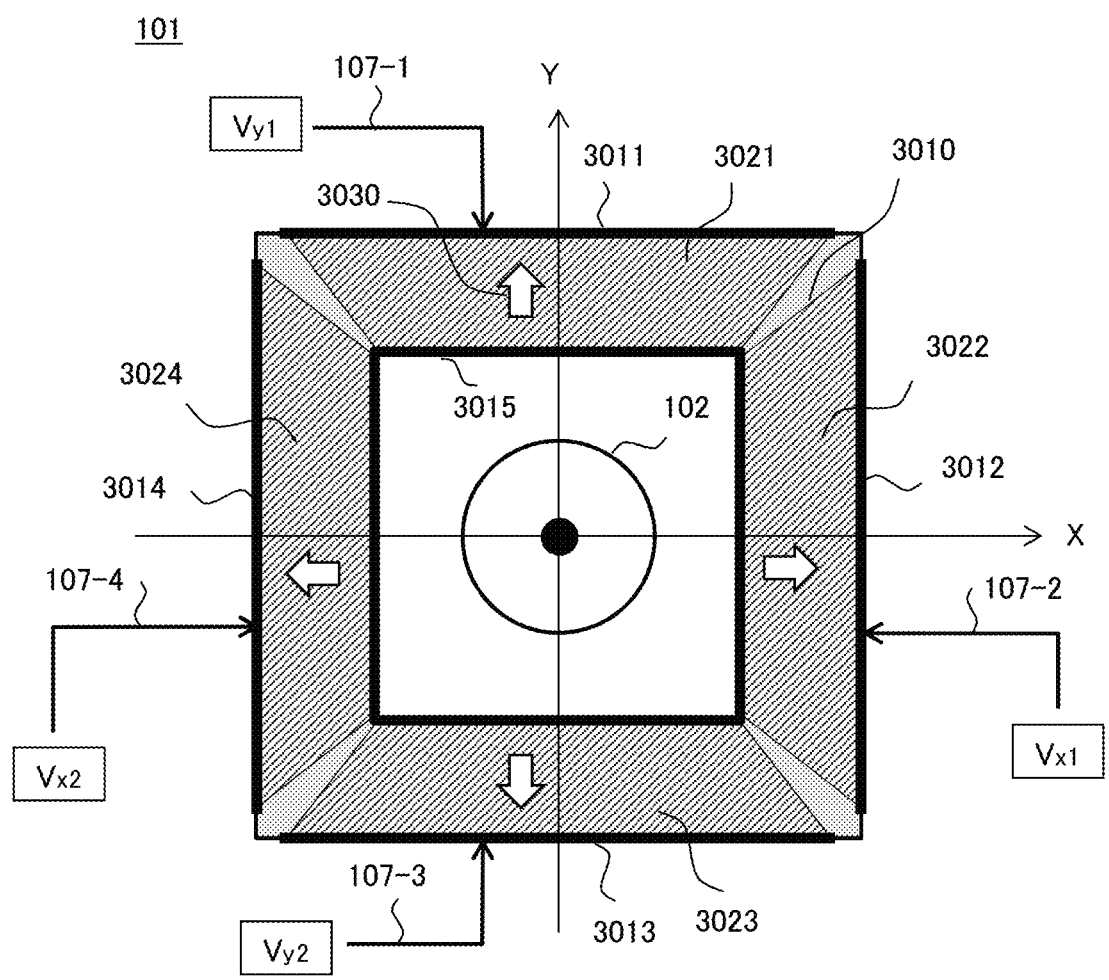
FIG. 5 is a cross-sectional view illustrating an example of a quadrangular tubular actuator.

For example, as illustrated in FIG. 5, it is possible to adopt a quadrangular tubular actuator. In this example, the common electrode 3015 is provided in the interior, and the four piezoelectric elements 3021 to 3024 are disposed on four sides, so that a cross section has a quadrangular shape. In other words, it is sufficient to adopt a configuration in which vibration is independently applied in the Y-axis direction and the X-axis direction.

FIG. 6 is a diagram illustrating an electrically equivalent circuit of the four piezoelectric elements. The respective piezoelectric elements 3021 to 3024 are represented by impedances $Z_1$ to $Z_4$. One end of each of the piezoelectric elements is connected to each of the outer peripheral electrodes 3011 to 3014, and the other end thereof is connected to the common electrode 3015. With regard to a potential applied to each of the electrodes, $V_{y1}$ is set for the first outer peripheral electrode 3011, $V_{x1}$ is set for the second outer peripheral electrode 3012, $V_{y2}$ is set for the third outer peripheral electrode 3013, and $V_{x2}$ is set for the fourth outer peripheral electrode 3014. In addition, a potential of the common electrode 3015 is set to $V_0$. A voltage applied to each of the piezoelectric elements is determined by a difference between a potential applied to each of the outer peripheral electrodes 3011 to 3014 and a potential of the inner peripheral electrode 3015.

Here, in a case in which the common inner peripheral electrode 3015 is connected to the ground potential, the potential $V_0$ of the inner peripheral electrode 3015 becomes 0. Thus, the voltages applied to the respective piezoelectric elements 3021 to 3024 are determined only by the potentials $V_{y1}$, $V_{x1}$, $V_{y2}$, and $V_{x2}$ applied to the outer peripheral electrodes 3011 to 3014 corresponding thereto. Therefore, it is possible to individually and independently control extension/contraction of each of the piezoelectric elements.

On the other hand, in the present embodiment, the inner peripheral electrode 3015 is set to a floating potential. For this reason, the potential $V_0$ of the inner peripheral electrode 3015 varies depending on the potentials applied to the four outer peripheral electrodes 3011 to 3014. When the potential $V_0$ of the inner peripheral electrode 3015 varies, unintended distortion occurs in the surrounding four piezoelectric elements 3021 to 3024. Therefore, in the present embodiment, conditions of voltages applied to the outer peripheral electrodes 3011 to 3014 were determined so that potential variation of the inner peripheral electrode 3015 was minimized and the pair of piezoelectric elements in the X-axis direction and the pair of piezoelectric elements in the Y-axis direction were independently controllable.

First, general expressions of the sinusoidal voltages $V_{y1}$, $V_{x1}$, $V_{y2}$ and $V_{x2}$ applied to the outer peripheral electrodes 3011 to 3014 are represented by the following Expressions (1) to (4).

[Expression 1]

$$V_{y1} = A_1 \sin(2\pi f_r t + \varphi_1) + C_1 \quad (1)$$

[Expression 2]

$$V_{x1} = A_2 \sin(2\pi f_r t + \varphi_2) + C_2 \quad (2)$$

[Expression 3]

$$V_{y2} = A_3 \sin(2\pi f_r t + \varphi_3) + C_3 \quad (3)$$

[Expression 4]

$$V_{x2} = A_4 \sin(2\pi f_r t + \varphi_4) + C_4 \quad (4)$$

Here, $A_1$, $A_2$, $A_3$, and $A4$ denote vibration amplitudes, $f_r$ denotes a resonance frequency, $\varphi_1$, $\varphi_2$, $\varphi_3$, and $\varphi_4$ denote phase differences of sinusoidal waves, and $C_1$, $C_2$, $C_3$, and $C_4$ denote offset components.

Next, the potential of the inner peripheral electrode 3015 will be obtained. In FIG. 6, since the four piezoelectric elements 3021 to 3024 correspond to a part of the same cylindrical piezoelectric actuator, it is presumed that the piezoelectric elements 3021 to 3024 have the same impedance value ($Z_1=Z_2=Z_3=Z_4$).

First, presuming that only the piezoelectric elements in the Y-axis direction are driven, the voltages $V_{y1}$ and $V_{y2}$ are applied to the first outer peripheral electrode 3011 and the third outer peripheral electrode 3013, and the second outer peripheral electrode 3012 and the fourth outer peripheral electrode 3014 are opened. A potential $V_{y0}$ of the inner peripheral electrode 3015 at this time is a midpoint potential (median value) between $V_{y1}$ and $V_{y2}$.

[Expression 5]

$$V_{y0} = \frac{V_{y1} + V_{y2}}{2} \quad (5)$$

Similarly, when it is presumed that only the piezoelectric elements in the X-axis direction are driven, a potential $V_{x0}$ of the inner peripheral electrode 3015 is a median value between the voltages $V_{x1}$ and $V_{x2}$ of the second outer peripheral electrode 3012 and the fourth outer peripheral electrode 3014.

[Expression 6]

$$V_{x0} = \frac{V_{x1} + V_{x2}}{2} \quad (6)$$

Next, in a case in which driving is simultaneously performed in the X-axis direction and the Y-axis direction, a midpoint potential $V_{y0}$ in the Y-axis direction and a midpoint potential $V_{x0}$ in the X-axis direction are set to substantially the same value. In other words, when Equation (7) below is satisfied, it is possible to reduce an influence on the X-axis direction from the Y-axis direction drive voltages $V_{y1}$ and $V_{y2}$ and conversely reduce an influence on the Y-axis direction from the X-axis direction drive voltages $V_{x1}$ and $V_{y2}$.

[Expression 7]

$$V_{y0} = V_{x0} \quad (7)$$

Here, the first piezoelectric element 3021 and the third piezoelectric element 3023 are a pair of piezoelectric elements in the Y-axis direction. When one of the piezoelectric elements contracts, the other one extends, that is, the piezoelectric elements may move in opposite phases. When it is presumed that $A_1=A_3$ and $\varphi_3=\varphi_1+180°$ to obtain such movement, the drive voltage $V_{y2}$ of the third piezoelectric element 3023 is transformed from Equation (3) to Equation (8).

[Expression 8]

$$V_{y2} = -A_1 \sin(2\pi f_r t + \varphi_1) + C_3 \quad (8)$$

In this instance, $V_{y0}=(C_1+C_3)/2$ is obtained from Equation (5).

Likewise for the pair of piezoelectric elements in the X-axis direction, it is presumed that $A_2=A_4$ and $\varphi_4=\varphi_2+180°$, and the drive voltage $V_{x2}$ of the fourth piezoelectric element 3024 is transformed from Equation (4) to Equation (9).

[Expression 9]

$$V_{x2} = -A_2 \sin(2\pi f_r t + \varphi_2) + C_4 \quad (9)$$

In this instance, $V_{x0}=(C_2+C_4)/2$ is obtained from Equation (6).

Therefore, to satisfy a condition of Equation (7), $V_{x0}=V_{y0}$ it suffices that $C_1+C_3=C_2+C_4$. In particular, Equation (7) is satisfied by setting $C_1=C_2=C_3=C_4$.

In addition, in the case of Equation (7), to reverse extension and contraction of the first piezoelectric element 3021 and the third piezoelectric element 3023 corresponding to the pair of piezoelectric elements in the Y-axis direction, with regard to a polarization direction of the piezoelectric element, voltages need to be applied in the same direction from the inner peripheral electrode 3015 to the respective outer peripheral electrodes 3011 and 3013 to perform polarization.

Likewise for the second piezoelectric element 3022 and the fourth piezoelectric element 3024 corresponding to the pair of piezoelectric elements in the X-axis direction, polarization needs to be performed in the same direction from the inner peripheral electrode 3015 to the respective outer peripheral electrodes 3012 and 3014.

In addition, $V_{y1}>0$, $V_{x1}>0$, $V_{y2}>0$, and $V_{x2}>0$ are obtained by setting $A_1<C_1$, $A_2<C_2$, $A_3<C_3$, $A_4<C_4$, $C_1>0$, $C_2>0$, $C_3>0$, and $C_4>0$. Therefore, no negative voltage is generated, an operational amplifier of an end power supply can be used as an amplifier circuit in the driving controller 1008, and a negative power supply becomes unnecessary.

In this way, the vibration portion 101 can independently vibrate the light guide path 102 in two axial directions of the Y-axis and the X-axis to scan light. For example, when a phase $\varphi_1$ of a Y-axis driving signal and a phase $\varphi_2$ of an X-axis driving signal are shifted by 90°, a locus of optical scanning corresponds to a locus drawing a circle. Furthermore, when the amplitude $A_1$ of the Y-axis driving signal and the amplitude $A_2$ of the X-axis driving signal are gradually increased over time, a locus of optical scanning increases in amplitude while drawing a circle to draw a spiral locus. As a result, it is possible to scan a point-like light spot in a planar shape. A driving signal satisfying the above conditions is generated by the driving signal generator 1007.

Figure 7:
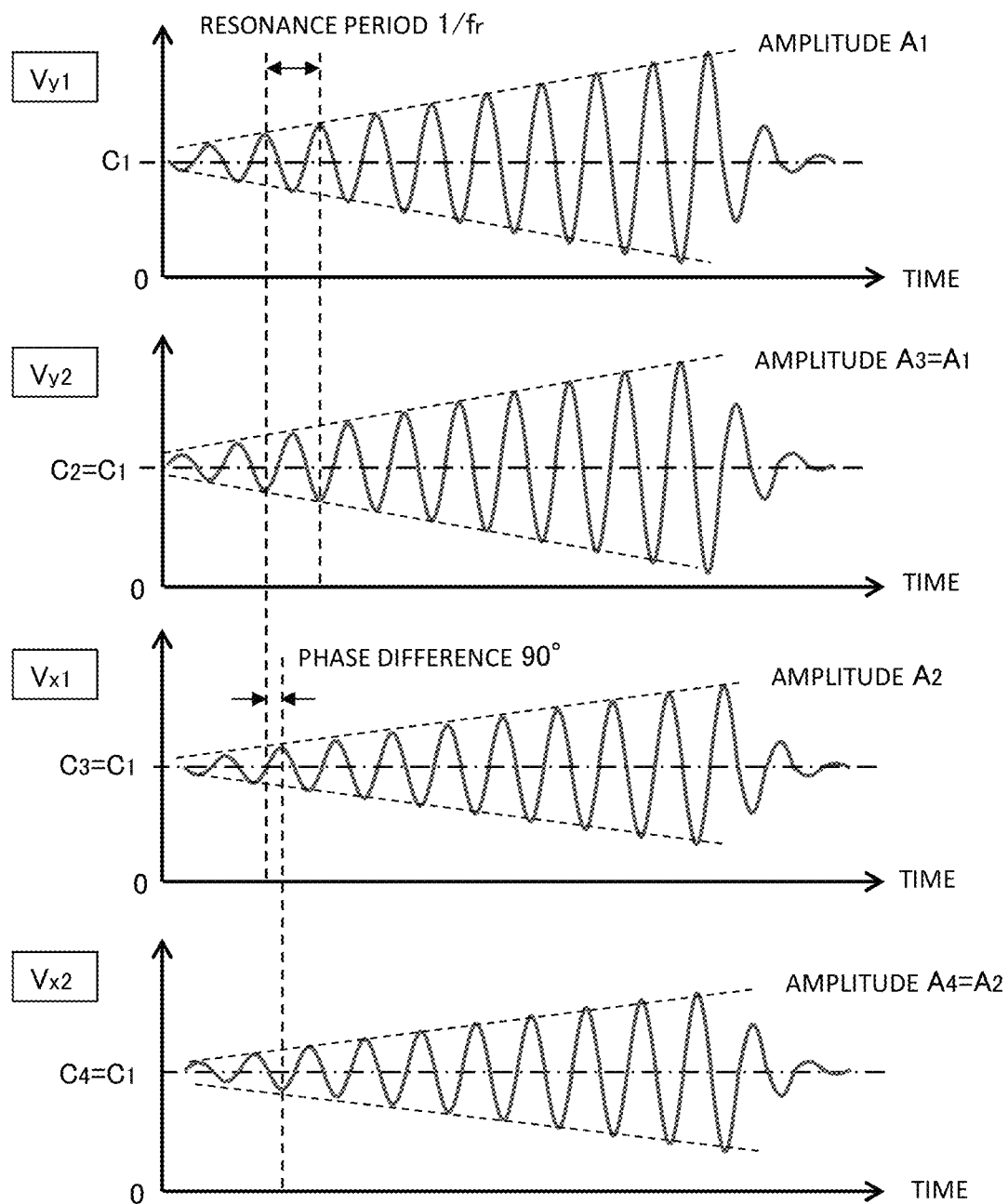
FIG. 7 is a diagram illustrating an example of a driving signal when spiral scanning is performed.

FIG. 7 is a diagram illustrating an example of a driving signal when spiral scanning is performed. Signal waveforms of the drive voltages $V_{y1}$, $V_{x1}$, $V_{y2}$, and $V_{x2}$ with respect to the outer peripheral electrodes 3011 to 3014 are illustrated. Offset components of the respective signals are made equal (in this case, $C_1$), and a resonance period $1/f_r$ corresponds to a natural frequency $f_r$. Further, while the phases of the Y-axis driving signal and the X-axis driving signal are shifted by 90°, the amplitude of each signal is increased over time.

Figure 8:
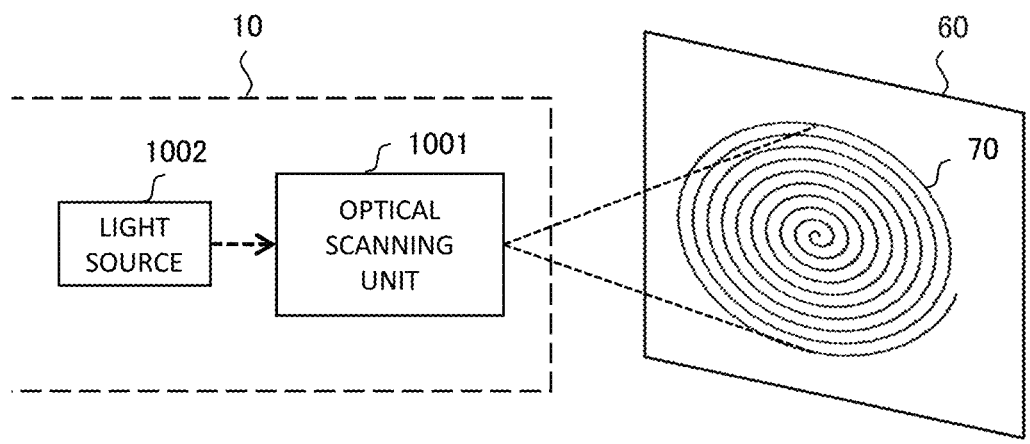
FIG. 8 is a diagram illustrating an example of a spiral locus generated on a screen.

FIG. 8 is a diagram illustrating an example of a spiral locus generated on a screen. A spiral locus 70 can be drawn on a screen 60 by performing optical scanning using the driving signal of FIG. 7.

A scanning locus by the optical scanning unit 1001 is not limited thereto, and can be made in various ways by a combination of a shape of the light guide path 102 and a driving signal. For example, when a cross section of the light guide path 102 is set to an elliptical shape to make resonance frequencies in the Y-axis direction and the X-axis direction different, and the Y-axis driving signal and the X-axis driving signal are supplied in accordance with these frequencies, it is possible to draw a zigzag locus on the screen.

According to Embodiment 1, since the inner peripheral electrode 3015 is set to a floating potential without being connected to the ground potential, the electrical wiring is simplified, which contributes to downsizing of the device. In this instance, when a condition of the drive voltage applied to the outer peripheral electrode is set to satisfy a predetermined condition, it is possible to keep the potential of the inner peripheral electrode 3015 constant regardless of the signal amplitude $A_1$ applied to the piezoelectric element in the Y-axis direction or the signal amplitude $A_2$ applied to the piezoelectric element in the X-axis direction. As a result, the vibration of the pair of piezoelectric elements in the Y-axis direction and the vibration of the pair of piezoelectric elements in the X-axis direction can be controlled independently of each other.

Incidentally, in the above example, the piezoelectric element is used as the actuator of the vibration portion. However, it is possible to use another element, for example, an electrostrictive element. In addition, the floating potential is set by using the electrode on the inner peripheral side as the common electrode. However, conversely, even when the floating potential is set by using the electrode on the outer peripheral side as the common electrode, it is possible to simplify the electrical wiring.

Embodiment 2

In Embodiment 1, all the impedances of the four piezoelectric elements are equal to each other. However, in practice, the impedances may not coincide with each other due to a manufacturing variation, etc. Therefore, Embodiment 2 adopts a configuration in which a driving signal is corrected in accordance with an impedance difference.

Figure 9:
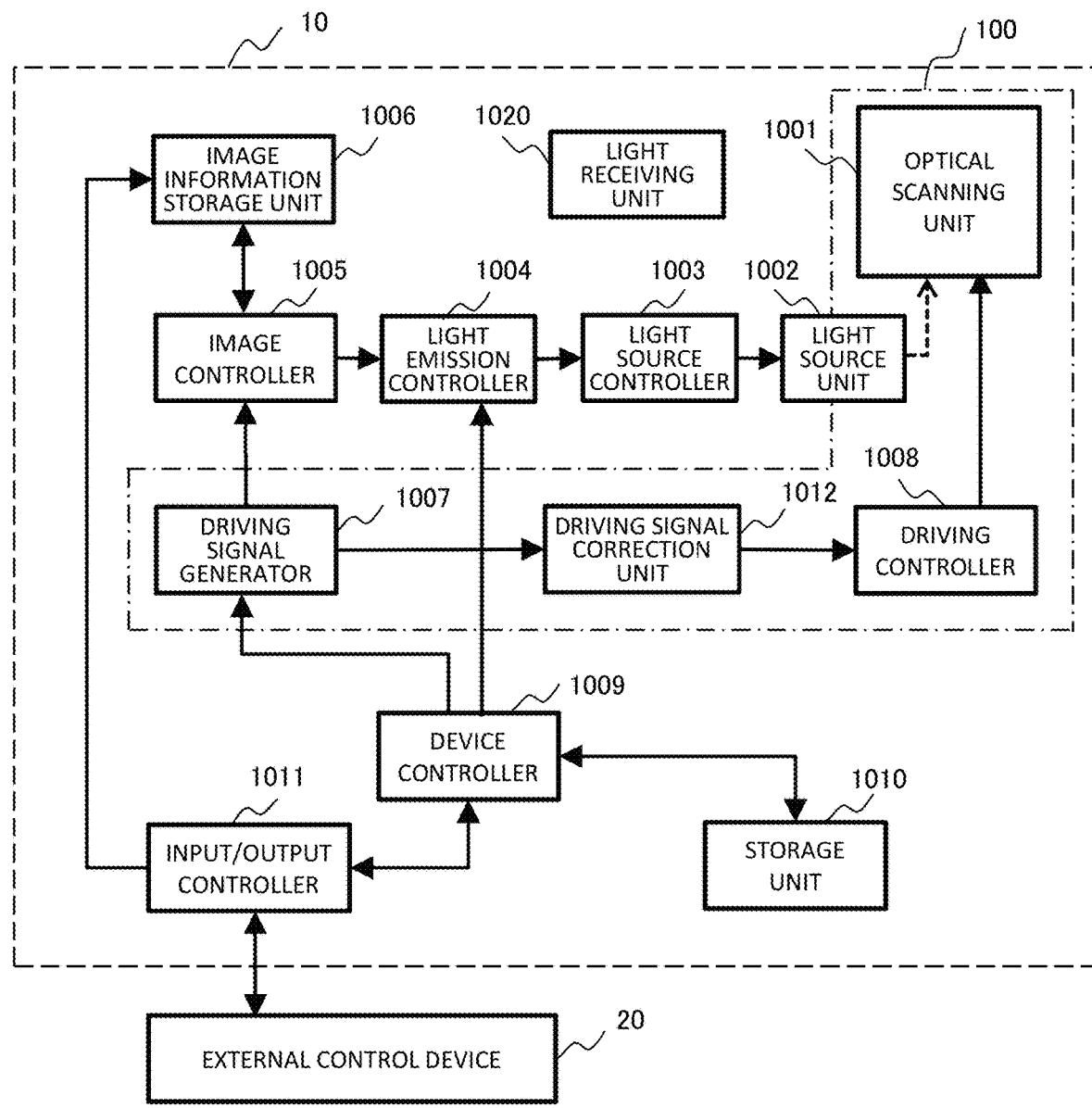
FIG. 9 is a block diagram illustrating a configuration of an imaging apparatus 10 according to Embodiment 2.

FIG. 9 is a block diagram illustrating a configuration of an imaging apparatus 10 according to Embodiment 2. The apparatus is configured such that a driving signal correction unit 1012 is added to the basic configuration of Embodiment 1 (FIG. 1).

The driving signal correction unit 1012 corrects a driving signal according to minute differences in the impedances of the four piezoelectric elements included in the vibration portion 101. That is, a driving signal obtained by correcting the amplitude of the driving signal generated by the driving signal generator 1007 is supplied to the driving controller 1008. Hereinafter, a description will be given of a method of correcting a driving signal.

Figure 10A:
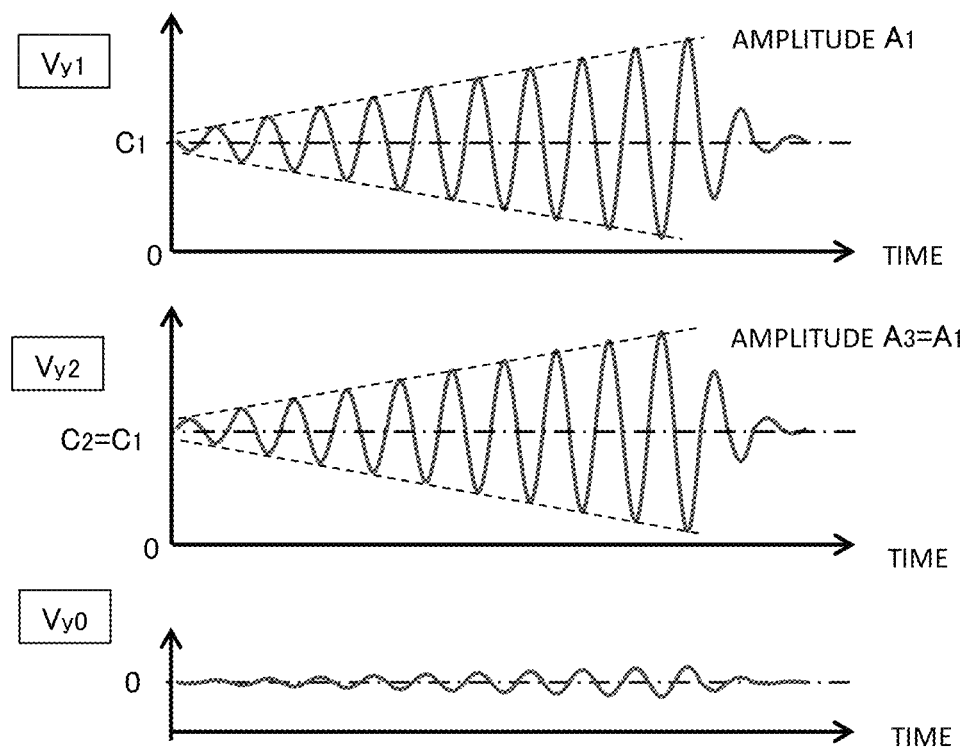
FIG. 10A is a diagram illustrating an example of potentials of driving signals and an inner peripheral electrode (before correction)
Figure 10B:
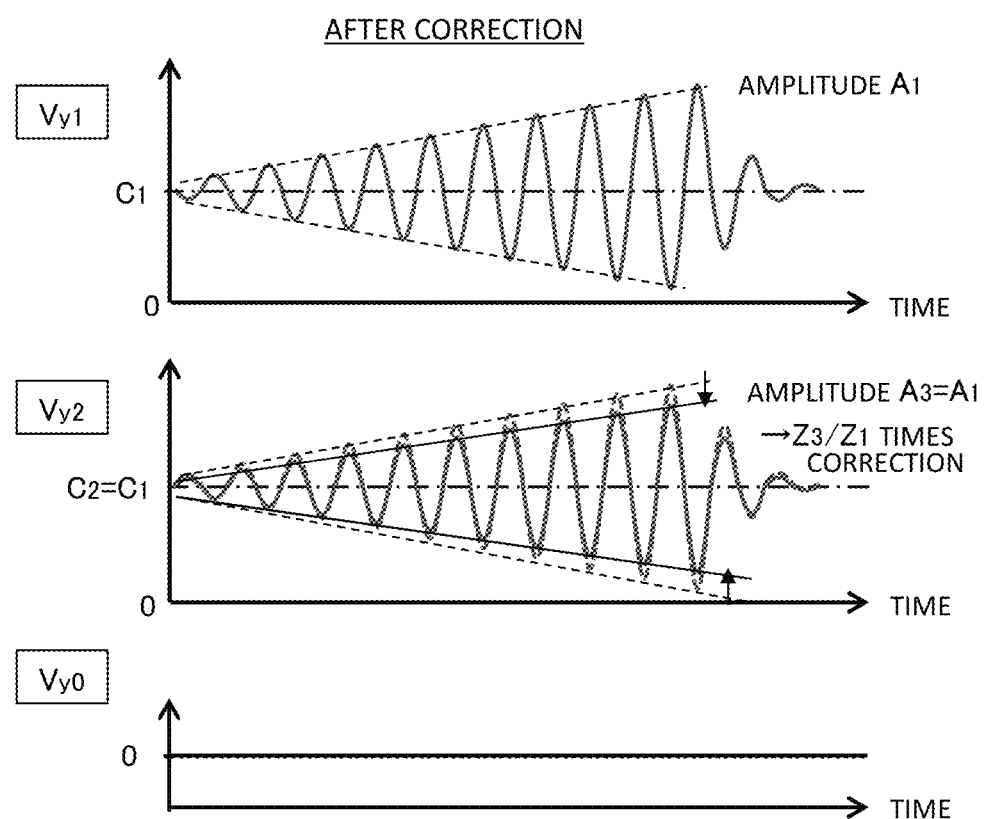
FIG. 10B is a diagram illustrating an example of potentials of the driving signals and the inner peripheral electrode (after correction)

FIG. 10A and FIG. 10B illustrate an example of potentials of the driving signals and the inner peripheral electrode, FIG. 10A illustrates signal waveforms before correction, and FIG. 10B illustrates signal waveforms after correction. Here, in a case in which there is a difference between the impedances $Z_1$ and $Z_3$ of the first piezoelectric element 3021 and the third piezoelectric element 3033 facing each other in the Y-axis direction, the driving signals $V_{y1}$ and $V_{y2}$ applied to the pair of piezoelectric elements and the potential $V_{y0}$ of the inner peripheral electrode 3015 are illustrated.

In FIG. 10A, in a case in which the driving signals $V_{y1}$ and $V_{y2}$ similar to those of Embodiment 1 are applied, when the impedances $Z_1$ and $Z_3$ of the piezoelectric elements are different from each other even though the amplitudes $A_1$ and $A_3$ thereof are equal to each other, the potential $V_{y0}$ of the inner peripheral electrode 3015 does not become 0, and a vibration component remains. This vibration component affects vibration in the X-axis direction.

To eliminate this vibration component, as illustrated in FIG. 10B, the driving signal correction unit 1012 corrects one of the drive voltages by an impedance ratio. In this example, the amplitude $A_3$ of the driving signal $V_{y2}$ is corrected to be the impedance ratio $(Z_3/Z_1)$ times. In this way, it is possible to set the potential $V_{y0}$ of the inner peripheral electrode 3015 to 0, and eliminate the vibration component.

In addition, the driving signal correction unit 1012 similarly performs correction based on a ratio of the impedances $Z_2$ and $Z_4$ with respect to the driving signals $V_{x1}$ and $V_{x2}$ applied to the pair of piezoelectric elements on the X-axis.

To perform the correction, the driving signal correction unit 1012 holds a correction amount calculated from the impedance of each piezoelectric element measured in advance. Alternatively, a user may visually evaluate a scanned display pattern and adjust a correction amount of the driving signal correction unit 1012 so that distortion is not visually recognized.

According to Embodiment 2, even when there is an electrical characteristic difference due to manufacturing variation of the piezoelectric element, it is possible to eliminate or reduce an interaction between Y-axis drive control and X-axis drive control.

Embodiment 3

In Embodiment 1, the waveform of the driving signal of the piezoelectric element has a sinusoidal shape. However, in Embodiment 3, a pulse-like driving signal is used.

Figure 11:
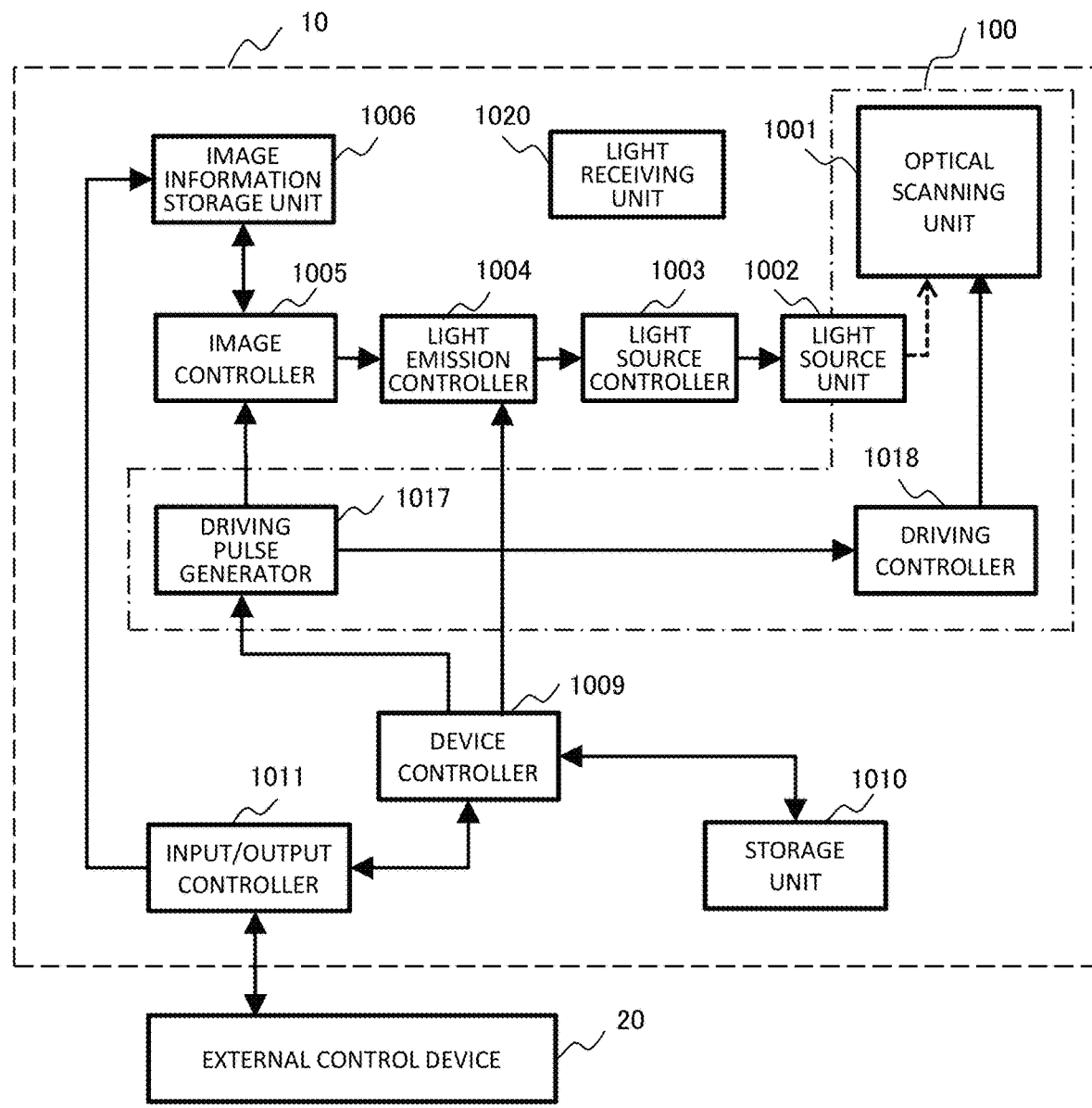
FIG. 11 is a block diagram illustrating a configuration of an imaging apparatus 10 according to Embodiment 3.

FIG. 11 is a block diagram illustrating a configuration of an imaging apparatus 10 according to Embodiment 3. The apparatus is configured such that a driving pulse generator 1017 and a driving controller 1018 replace corresponding units of the basic configuration of Embodiment 1 (FIG. 1). The driving pulse generator 1017 generates a driving pulse as a driving signal, and the driving controller 1018 applies a drive voltage to the optical scanning unit 1001 (the vibration portion 101) based thereon.

Figure 12A:
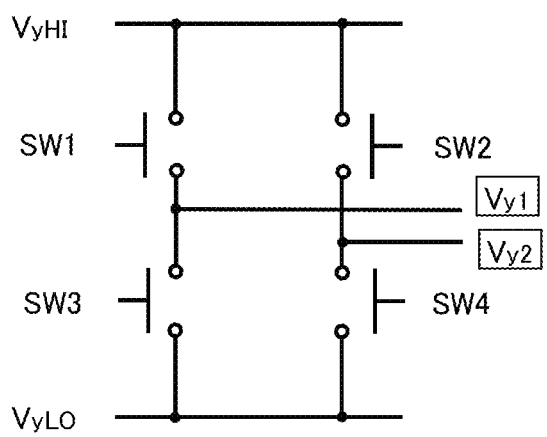
FIGS. 12A-12B are diagrams illustrating a configuration example of a driving controller 1018.
Figure 12B:
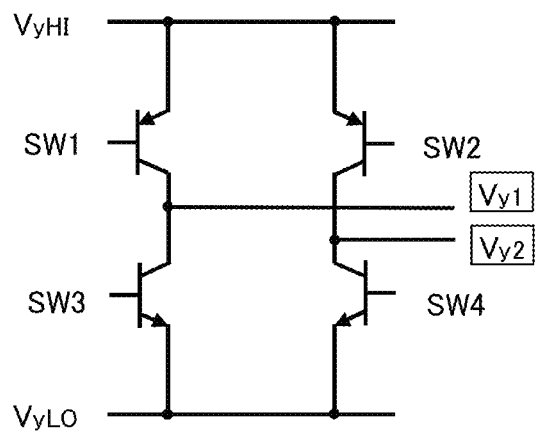

FIGS. 12A-12B are diagrams illustrating a configuration example of the driving controller 1018. Here, a gate circuit such as an H bridge circuit is used. As a switching element, FIG. 12A uses a MOSFET and FIG. 12B uses a transistor. Here, a driving circuit in which a voltage is applied to the pair of piezoelectric elements on the Y-axis is illustrated. However, the same is applied to the pair of piezoelectric elements on the X-axis.

Supply voltages $V_{yHI}$ and $V_{yLO}$ are supplied to upper and lower terminals of the H bridge circuit. Further, switching ON/OFF of four switching elements SW1 to SW4 is performed according to the driving pulse generated by the driving pulse generator 1017. As a switching state, a first state in which SW1 and SW4 are turned ON, a second state in which SW2 and SW3 are turned ON, and a third state in which all SWs are turned OFF are combined. As a result, the drive voltages $V_{y1}$ and $V_{y2}$ are applied to the pair of piezoelectric elements.

In a pulse driving scheme, it is possible to vibrate the vibration portion 101 similarly to sinusoidal wave driving of Embodiment 1 by changing either or both of the pulse width and the pulse amplitude.

Figure 13A:
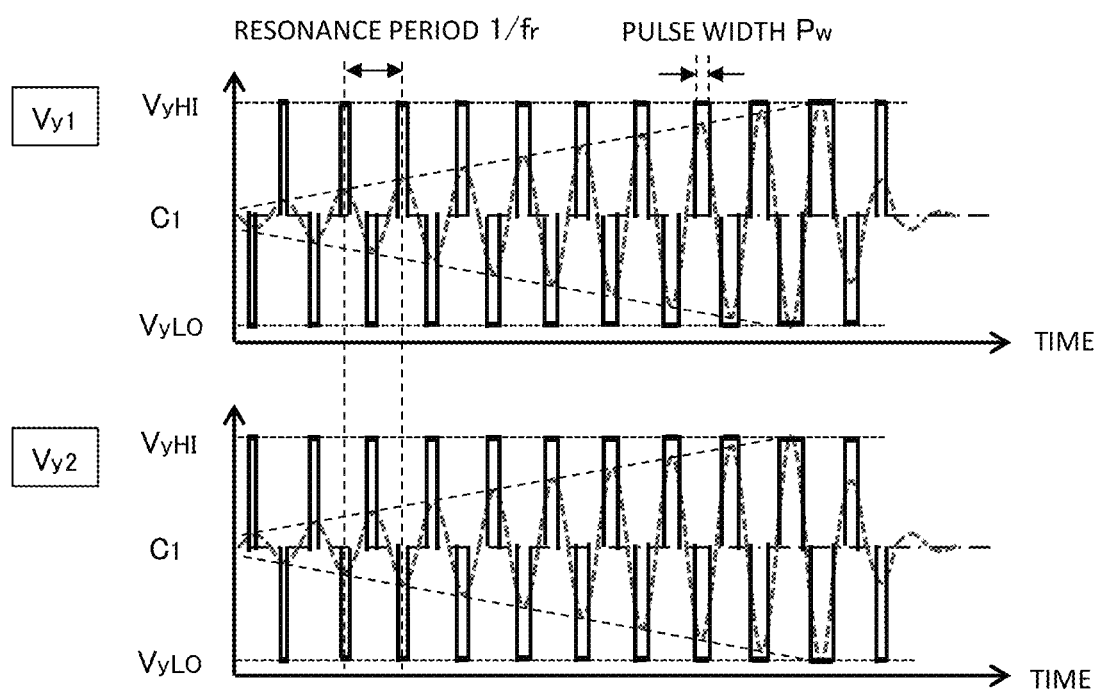
FIG. 13A is a diagram illustrating an example of a voltage waveform applied to the vibration portion 101.

FIG. 13A and FIG. 13B are diagrams illustrating two examples of a voltage waveform applied to the vibration portion 101. The voltages $V_{y1}$ and $V_{y2}$ applied to the pair of piezoelectric elements in the Y-axis direction are indicated by solid lines, and a vibration state of the vibration portion 101 resulting therefrom is indicated by a broken line.

FIG. 13A corresponds to a case in which the pulse amplitude is constant and the pulse width is changed to perform driving. In the first state in which SW1 and SW4 are turned ON, $V_{y1}$ is at a level of $V_{yHI}$ and $V_{y2}$ is at a level of $V_{yLO}$. Meanwhile, in the second state in which SW2 and SW3 are turned ON, $V_{y1}$ is at the level of $V_{yHI}$ and $V_{y2}$ is at the level of $V_{yLO}$. When the first state and the second state are repeated at the resonance period $1/f_r$, periodic vibration is applied to the vibration portion 101. In addition, when a length of a period between the first state and the second state, that is, a pulse width $P_w$ is changed, it is possible to change an effective drive voltage and control the magnitude of vibration.

In addition, the light guide path 102 that vibrates by the vibration portion 101 has the natural frequency $f_r$ corresponding to the resonance period. Thus, even in the case of the pulse-like driving signal, only a resonance frequency component does not attenuate and remains as vibration. Therefore, as a result, it is possible to obtain a vibration state indicated by a sinusoidal wave which is indicated by a broken line.

In addition, as illustrated in FIG. 13B, modulation may be performed by changing voltage values of $V_{yHI}$ and $V_{yLO}$, that is, a pulse amplitude $P_a$ while keeping the length of the period between the first state and the second state constant.

For the pair of piezoelectric elements on the X-axis side, a gate circuit similar to that of FIG. 12 is provided, and voltages $V_{xHI}$ and $V_{xLO}$ are switched and applied as a driving waveform having a phase different from that of vibration on the Y-axis side by 90°. In this instance, values of $V_{yHI}$, $V_{yLO}$, $V_{xHI}$, and $V_{xLO}$ are set such that a median value $V_{yC}$ of $V_{yHI}$ and $V_{yLO}$ and a median value $V_{xC}$ of $V_{xHI}$ and $V_{xLO}$ coincide with each other. When a control operation is performed in this way, similarly to Embodiment 1, it is possible to eliminate or reduce an interaction between the driving signal on the Y-axis side and the driving signal on the X-axis side.

According to Embodiment 3, the driving circuit of the optical scanning unit 1001 (the vibration portion 101) is configured as a digital circuit (gate circuit). Thus, there is an effect that the circuit can be simplified when compared to an analog circuit.

Embodiment 4

The optical scanner 100 is applicable to a device that measures a distance to an object from an arrival time of a laser beam which is emitted and scattered or reflected from the object in addition to the imaging apparatus 10 that projects an image. In Embodiment 4, a description will be given of an imaging apparatus having a distance measurement function.

Figure 14:
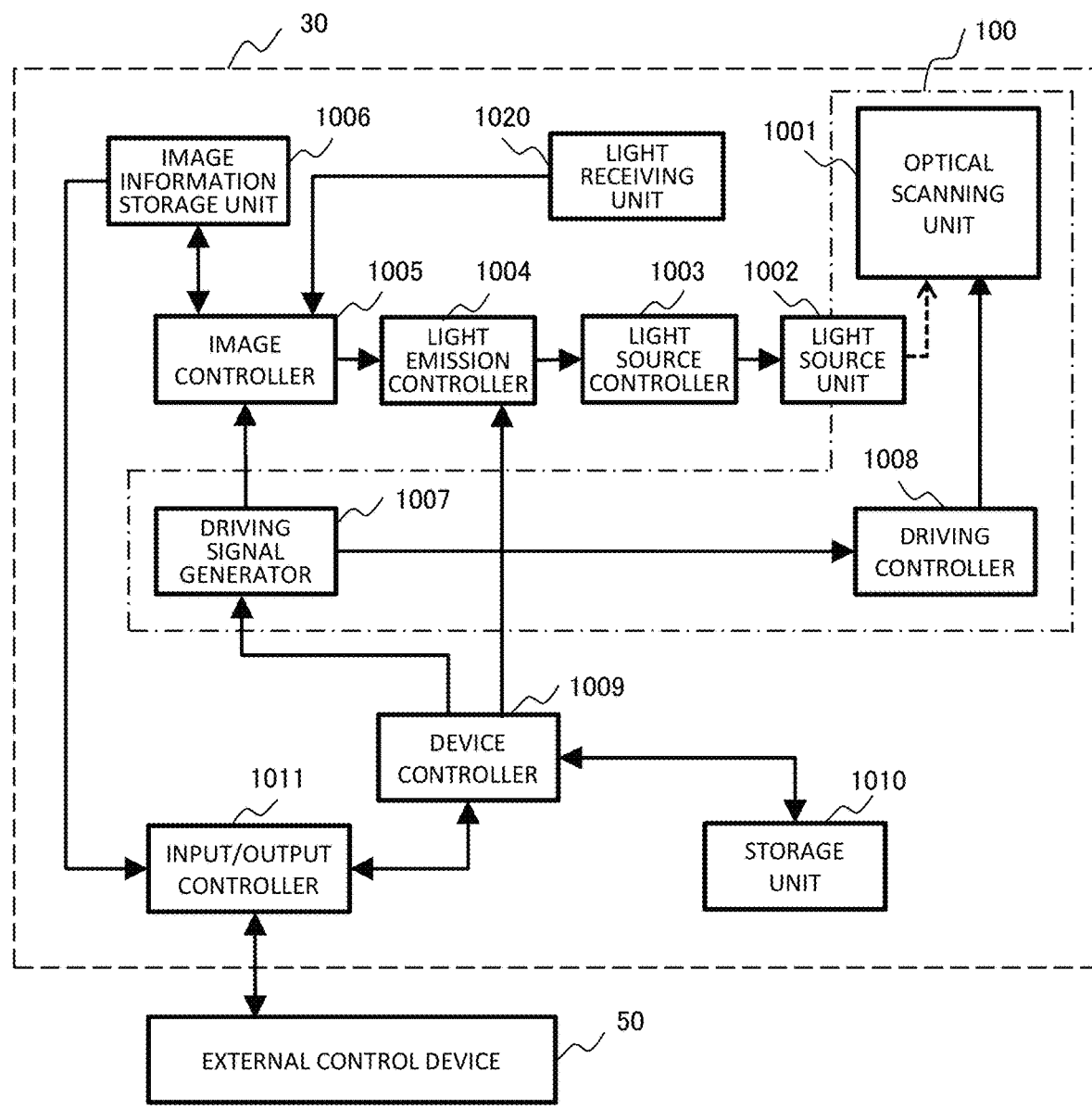
FIG. 14 is a diagram illustrating a configuration of an imaging apparatus 30 having a distance measurement function according to Embodiment 4.

FIG. 14 is a block diagram illustrating a configuration of an imaging apparatus 30 having a distance measurement function according to Embodiment 4.

The imaging apparatus 30 includes an optical scanning unit 1001, a light source unit 1002, a light source controller 1003, a light emission controller 1004, an image controller 1005, an image information storage unit 1006, a driving signal generator 1007, a driving controller 1008, a device controller 1009, a storage unit 1010, an input/output controller 1011, and a light receiving unit 1020. Among these units, the components other than the light emission controller 1004, the image controller 1005, the image information storage unit 1006, and the light receiving unit 1020 are the same as those of Embodiment 1 (FIG. 1), and a description thereof will be omitted. The light emission controller 1004 and the image controller 1005 may be implemented as a digital circuit as an example, and the light emission controller 1004, the image controller 1005, and the driving signal generator 1007 may be present as functional blocks in an integrated circuit such as an identical IC, for example, an FPGA, an ASIC, etc.

The light emission controller 1004 generates a signal for performing laser emission from the light source unit 1002 at a predetermined timing. The light emission controller 1004 may correct timing or brightness based on information from the driving signal generator 1007.

The light receiving unit 1020 includes a light receiving element that converts light into an electric signal such as a photodetector. In addition to the light receiving element, the light receiving unit 1020 may include an optical waveguide, an optical amplifier, an electric signal amplifying circuit, an analog-digital converting circuit, etc. The light receiving unit 1020 generates light reception information corresponding to the received light. For example, the light reception information corresponds to received light intensity information according to the intensity of the received light, information (distance information) on a timing at which the received light intensity changes, etc. In this example, a description will be given taking light receiving timing information as an example.

The imaging apparatus 30 is connected to an external control device 50 via the input/output controller 1011. The imaging apparatus 30 transmits captured image information (distance information to the object) to the external control device 50. For example, the external control device 50 corresponds to a display device that displays image information, a recording device that stores image information, etc.

FIG. 15 is a diagram illustrating an imaging operation of the imaging apparatus 30 of the present embodiment. The imaging apparatus 30 operates as an image pickup apparatus and irradiates an imaging target 70 with a laser beam output from the light source unit 1002. The irradiated laser beam is reflected or scattered on a surface of the imaging target 70, and a part of the reflected light or scattered light is received by the light receiving unit 1020. In this instance, the optical scanning unit 1001 scans a position of the laser beam irradiated on the imaging target 70 in the same manner as in the descriptions of Embodiments 1 to 3.

The image controller 1005 receives a synchronization signal from the driving signal generator 1007 and calculates coordinates (x, y) determined according to an optical scanning position. Furthermore, the image controller 1005 receives the light reception information from the light receiving unit 1020, and writes pixel data corresponding to the light reception information and the coordinates (x, y) to the image information storage unit 1006. Here, for example, the pixel data is gradation data corresponding to light receiving timing information (distance information).

The image information storage unit 1006 receives the pixel data from the image controller 1005 and holds screen data including a plurality of pieces of pixel data. The input/output controller 1011 outputs the screen data held in the image information storage unit 1006 to the external control device 50 at predetermined intervals. In this way, the imaging apparatus 30 can transmit image information obtained by measuring a distance to the imaging target 70 to the external control device 50, and the external control device 50 can display and accumulate the received image information.

Each of the above embodiments specifically and concretely describes configurations of an apparatus and a system to describe the invention in an easy-to-understand manner, and may not include all the described configurations. In addition, a part of a configuration of a certain embodiment may be replaced with a configuration of another embodiment, and a configuration of a certain embodiment may be added to a configuration of another embodiment.

What is claimed is:

1. An optical scanner comprising:
   a light guide path having one end from which light enters and the other end from which the light is emitted;
   a vibration portion that applies vibration to the light guide path; and
   a driving signal generator that generates a driving signal for applying vibration to the vibration portion,
   wherein the vibration portion includes a first element and a third element cooperatively operating to vibrate the light guide path in a direction substantially perpendicular to an optical axis direction of the light guide path, and a second element and a fourth element cooperatively operating to vibrate the light guide path in a direction substantially perpendicular to the optical axis direction of the light guide path and substantially perpendicular to a vibration direction of the first element and the third element,
   each of the first to fourth elements has two electrodes, a driving signal from the driving signal generator is applied to one of the electrodes of each of the first to fourth elements, and the other electrode of each of the first to fourth elements is used as a common electrode having a floating potential with respect to the driving signal, and
   the driving signal generator generates a driving signal such that a median value of a driving signal applied to the first element and a driving signal applied to the third element and a median value of a driving signal applied to the second element and a driving signal applied to the fourth element correspond to substantially the same value.

2. The optical scanner according to claim 1, wherein the first to fourth elements are obtained by dividing a cylindrical piezoelectric element disposed to surround the light guide path into four parts in a circumferential direction.

3. The optical scanner according to claim 2, wherein the common electrode is an electrode on an inner peripheral side of the cylindrical piezoelectric element.

4. The optical scanner according to claim 3, wherein polarization directions of the first element and the third element correspond to the same direction when viewed from a side of the common electrode, and polarization directions of the second element and the fourth element correspond to the same direction when viewed from the side of the common electrode.

5. The optical scanner according to claim 1, wherein the driving signal generator generates a sinusoidal driving signal corresponding to a natural frequency of the light guide path.

6. The optical scanner according to claim 1, wherein the driving signal generator generates a pulse-like driving signal having a period corresponding to a natural frequency of the light guide path.

7. The optical scanner according to claim 1, further comprising
   a driving signal correction unit that corrects a driving signal generated by the driving signal generator according to an impedance difference between the first element and the third element and an impedance difference between the second element and the fourth element.

8. An imaging apparatus using the optical scanner according to claim 1, the imaging apparatus comprising:
   a light source unit that generates a laser beam to emit the generated laser beam to the light guide path in the optical scanner;
   a light emission controller that controls light emission of the light source unit according to an image signal; and
   a device controller that causes laser emission synchronized with an optical scanning position by controlling the driving signal generator in the optical scanner and the light emission controller.

* * * * *